United States Patent
Yu et al.

(10) Patent No.: US 6,815,268 B1
(45) Date of Patent: Nov. 9, 2004

(54) METHOD FOR FORMING A GATE IN A FINFET DEVICE

(75) Inventors: Bin Yu, Cupertino, CA (US); Judy Xilin An, San Jose, CA (US); Srikanteswara Dakshina-Murthy, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 137 days.

(21) Appl. No.: 10/301,732

(22) Filed: Nov. 22, 2002

(51) Int. Cl.[7] .......................... H01L 21/00; H01L 21/84
(52) U.S. Cl. ..................... 438/149; 438/151; 438/157; 438/164; 438/585
(58) Field of Search ............................ 438/149, 151, 438/164, 585

(56) References Cited

U.S. PATENT DOCUMENTS

| | | | |
|---|---|---|---|
| 6,342,410 B1 * | 1/2002 | Yu ............................ | 438/164 |
| 6,396,108 B1 * | 5/2002 | Krivokapic et al. ......... | 257/365 |
| 6,413,802 B1 * | 7/2002 | Hu et al. .................... | 438/151 |
| 6,458,662 B1 * | 10/2002 | Yu ............................ | 438/286 |
| 6,475,869 B1 * | 11/2002 | Yu ............................ | 438/303 |
| 6,475,890 B1 * | 11/2002 | Yu ............................ | 438/574 |
| 6,562,665 B1 * | 5/2003 | Yu ............................ | 438/149 |
| 6,611,029 B1 * | 8/2003 | Ahmed et al. .............. | 257/365 |
| 6,642,090 B1 * | 11/2003 | Fried et al. ................. | 438/164 |
| 6,657,259 B2 * | 12/2003 | Fried et al. ................. | 257/350 |
| 6,686,231 B1 * | 2/2004 | Ahmed et al. .............. | 438/164 |

OTHER PUBLICATIONS

Digh Hisamoto et al., "FinFET—A Self–Aligned Double–Gate MOSFET Scalable to 20 nm," IEEE Transactions on Electron Devices, vol. 47, No. 12, Dec. 2000, pp. 2320–2325.
Yang–Kyu Choi et al., "Sub–20nm CMOS FinFET Technologies," 2001 IEEE, IEDM, pp. 421–424.
Xuejue Huang et al., "Sub–50 nm P–Channel FinFET," IEEE Transactions on Electron Devices, vol. 48, No. 5, May 2001, pp. 880–886.
Xuejue Huang et al., "Sub 50–nm FinFET: PMOS," 1999 IEEE, IEDM, pp. 67–70.
Yang–Kyu Choi et al., "Nanoscale CMOS Spacer FinFET for the Terabit Era," IEEE Electron Device Letters, vol. 23, No. 1, Jan. 2002, pp. 25–27.

* cited by examiner

*Primary Examiner*—Kim Duncan
*Assistant Examiner*—Angel Roman
(74) *Attorney, Agent, or Firm*—Harrity & Snyder, LLP

(57) ABSTRACT

A method of forming a gate in a FinFET device includes forming a fin on an insulating layer, forming source/drain regions and forming a gate oxide on the fin. The method also includes depositing a gate material over the insulating layer and the fin, depositing a barrier layer over the gate material and depositing a bottom anti-reflective coating (BARC) layer over the barrier layer. The method further includes forming a gate mask over the BARC layer, etching the BARC layer, where the etching terminates on the barrier layer, and etching the gate material to form the gate.

19 Claims, 12 Drawing Sheets

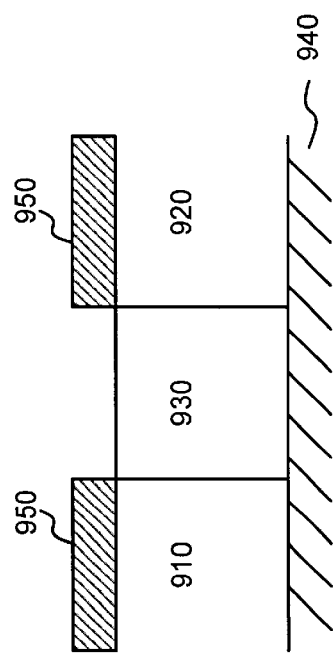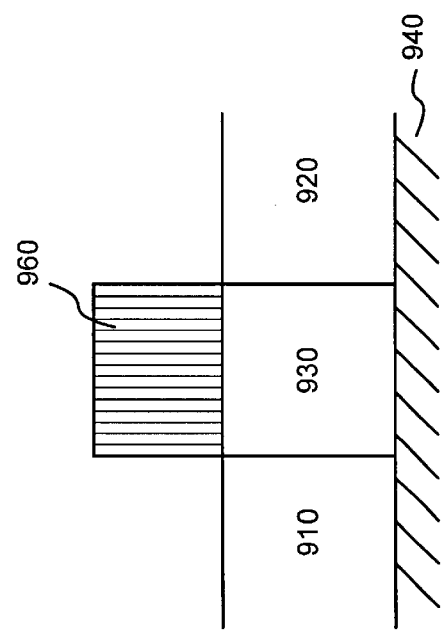
FIG. 9A
FIG. 9B

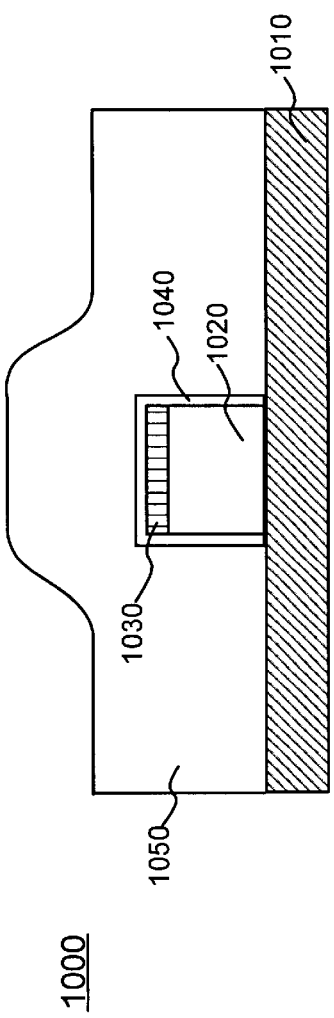
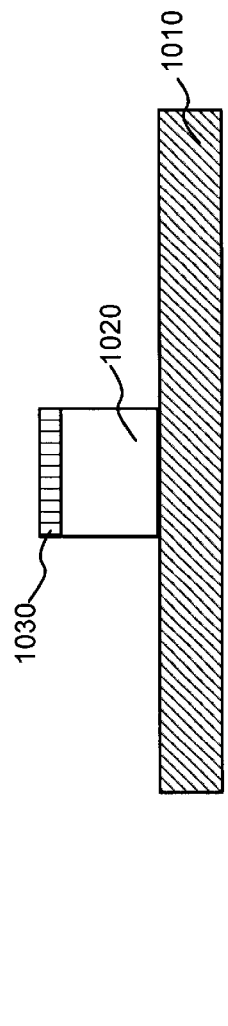

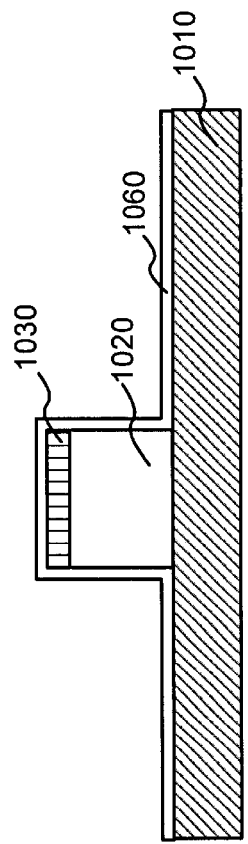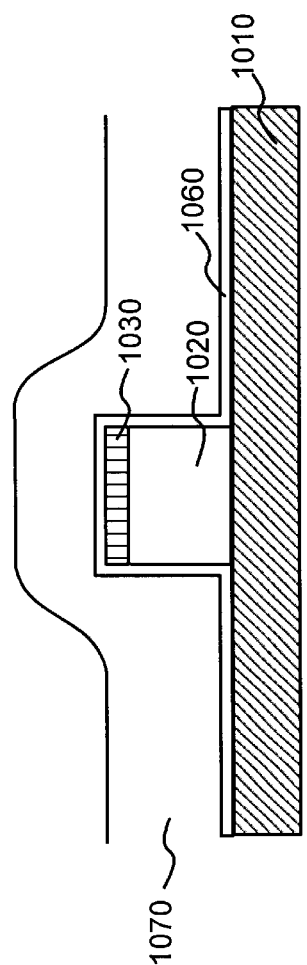
FIG. 10C
FIG. 10D

METHOD FOR FORMING A GATE IN A FINFET DEVICE

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 canometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide methodology for forming a gate in a FinFET device. The gate may be formed without damaging other regions of the FinFET device, such as source/drain regions.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a method of forming a gate in a FinFET device. The method includes forming a resist mask over a portion of a silicon on insulator (SOI) wafer, where the SOI wafer includes a silicon layer on an insulating layer. The method also includes etching the silicon layer not covered by the resist mask to form a fin, where the fin has a plurality of side surfaces and a top surface, forming a gate oxide on the side surfaces and the top surface of the fin and depositing a gate layer over the fin. The method further includes depositing a dielectric layer over the gate layer, depositing a bottom anti-reflective coating (BARC) layer over the dielectric layer and forming a gate mask over the BARC layer. The method also includes etching the BARC layer, where the etching terminates on the dielectric layer and etching the gate layer to form the gate.

According to another aspect of the invention, a method of manufacturing a semiconductor device is provided. The method includes forming a fin structure on an insulating layer, the fin structure having a plurality of side surfaces, a top surface and a bottom surface, forming source and drain regions and forming a gate dielectric on at least a first and second side surface of the fin. The method also includes depositing a gate material over the insulating layer and the fin structure, forming a dielectric layer over the gate material and depositing an anti-reflective coating (ARC) layer over the dielectric layer. The method further includes forming a gate mask over the ARC layer, etching the ARC layer, where the etching terminates on the dielectric layer and etching the gate material to form at least one gate.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 9A and 9B are cross-sections illustrating the formation of a gate structure in accordance with another embodiment of the present invention.

FIGS. 10A-10D are cross-sections illustrating the formation of high-K gate dielectric layer and a metal gate in accordance with another embodiment of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide methods of manufacturing FinFET devices. In one implementation, an etch barrier may be formed to prevent the gate material from being attacked during etching. The etch barrier allows various materials to be completely etched, thereby avoiding undesired residual materials caused by incomplete etching.

Figure 1:
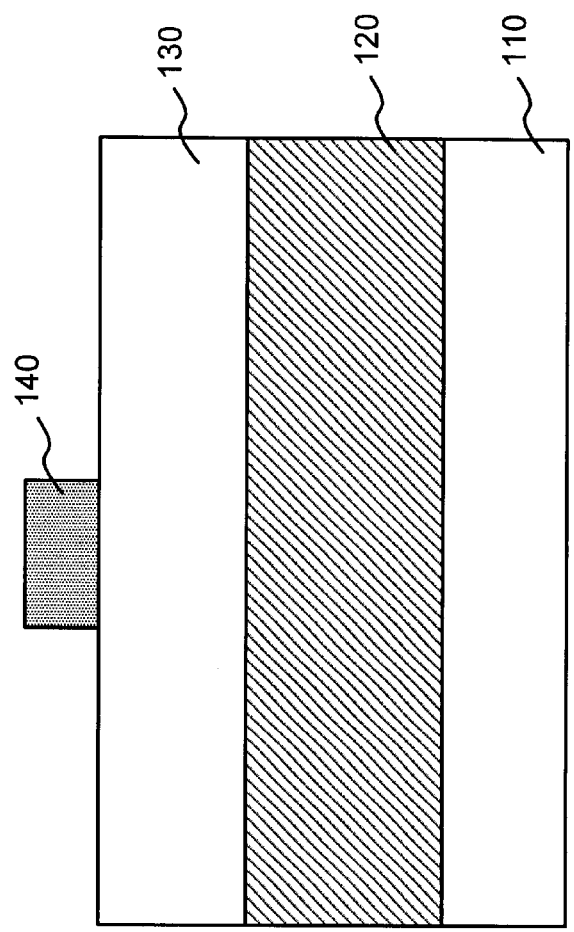
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

In an exemplary implementation, buried oxide layer 120 may include a silicon oxide, such as $SiO_2$, and may have a thickness ranging from about 1500 Å to about 3000 Å. Silicon layer 130 may include monocrystalline or polycrystalline silicon having a thickness ranging from about 200 Å to about 1000 Å. Silicon layer 130 is used to form a fin for a FinFET transistor device, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

A photoresist material may be deposited and patterned to form a photoresist mask 140 for subsequent processing. The photoresist may be deposited and patterned in any conventional manner.

Figure 2A:
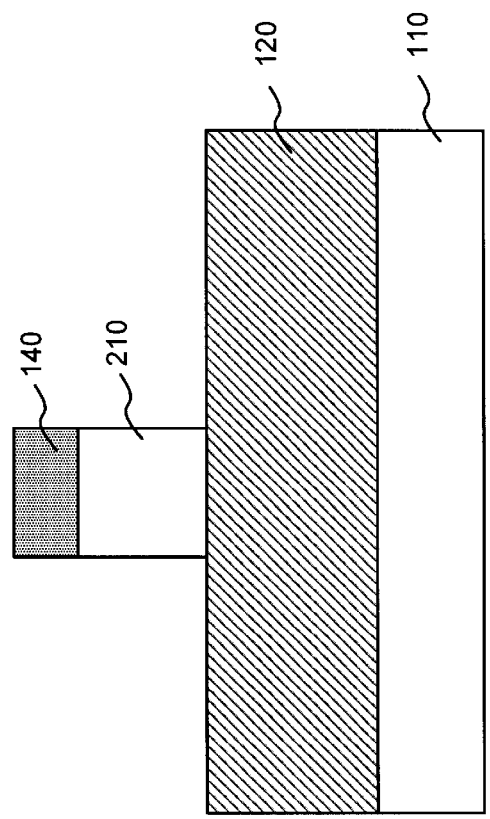
FIG. 2A is a cross-section illustrating the formation of a fin in accordance with an exemplary embodiment of the present invention.

Semiconductor device 100 may then be etched. In an exemplary implementation, silicon layer 130 may be etched in a conventional manner, with the etching terminating on buried oxide layer 120, as illustrated in FIG. 2A. Referring to FIG. 2A, silicon layer 130 has been etched to form fin 210.

Figure 2B:
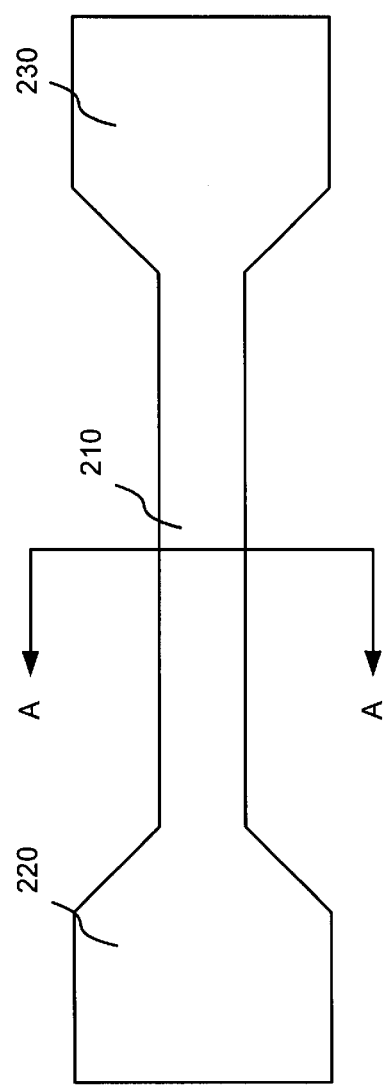
FIG. 2B schematically illustrates the top view of the semiconductor device of FIG. 2A in accordance with an exemplary embodiment of the present invention.

After the formation of fin 210, source and drain regions may be formed adjacent the respective ends of fin 210. For example, in an exemplary embodiment, a layer of silicon, germanium or combination of silicon and germanium may be deposited, patterned and etched in a conventional manner to form source and drain regions. FIG. 2B illustrates a top view of semiconductor 100 including source region 220 and drain region 230 formed adjacent fin 210 on buried oxide layer 120, according to an exemplary embodiment of the present invention. The top view in FIG. 2B is oriented such that the cross-section in FIG. 2A is taken along line AA in FIG. 2B.

Figure 3:
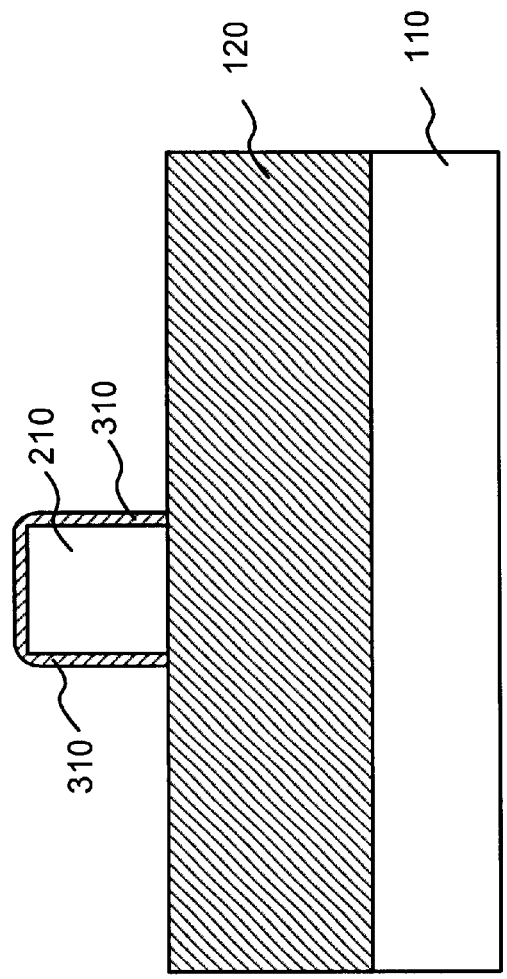
FIG. 3 is a cross-section illustrating the formation of a gate dielectric layer on the fin of FIG. 2A in accordance with an exemplary embodiment of the present invention.

The photoresist mask 140 may be removed and a dielectric layer may then be formed on fin 210. For example, a thin oxide film 310 may be thermally grown on fin 210, as illustrated in FIG. 3. The cross-sectional view of FIG. 3 is taken along line AA in FIG. 2B. The oxide film 310 may be grown to a thickness of about 10 Å to about 30 Å and may be formed on the exposed silicon side surfaces and top surface of fin 210 to act as a gate dielectric layer.

Figure 4:
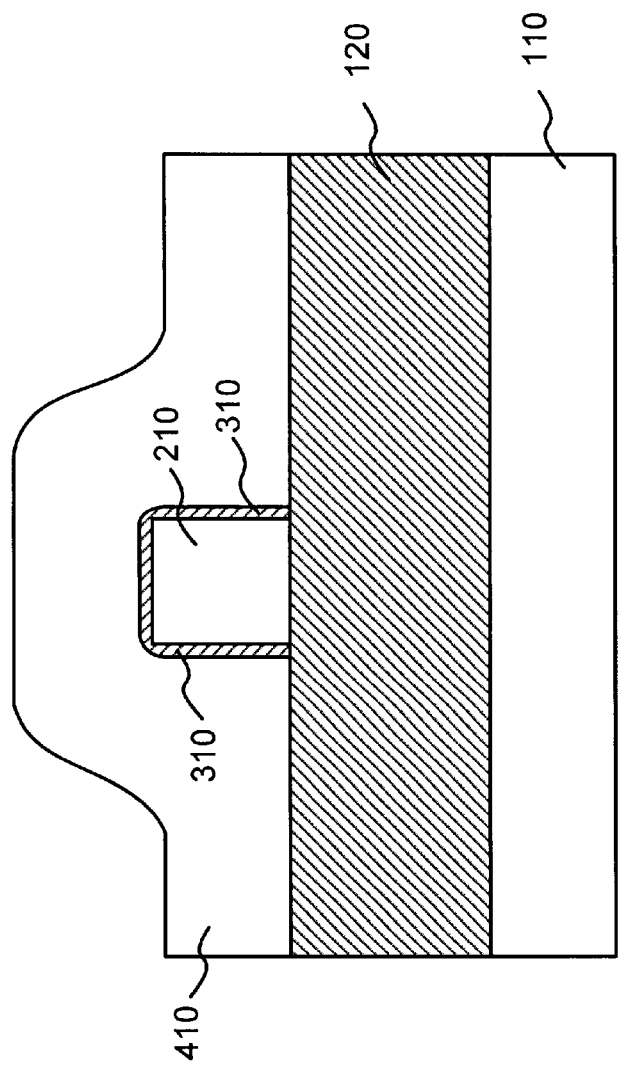
FIG. 4 is a cross-section illustrating the formation of a gate material on the device of FIG. 3 in accordance with an exemplary embodiment of the present invention.

A silicon layer 410 may then be deposited over semiconductor device 100 in a conventional manner, as illustrated in FIG. 4. The silicon layer 410 may be used as gate material for the subsequently formed gate(s). In an exemplary implementation, the silicon layer 410 may include polysilicon deposited using conventional chemical vapor deposition (CVD) to a thickness ranging from about 500 Å to about 1000 Å. Alternatively, other semiconducting materials, such as germanium or combinations of silicon and germanium, or various metals may be used as the gate material.

Figure 5:
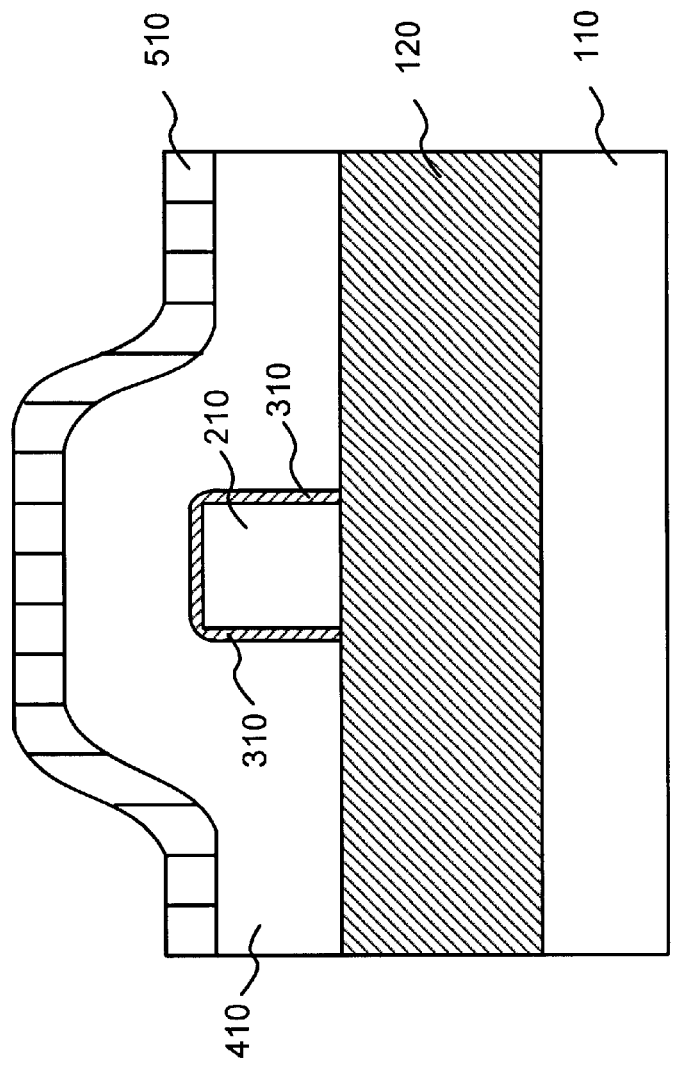
FIG. 5 is a cross-section illustrating the formation of a barrier dielectric layer on the device of FIG. 4 in accordance with an exemplary embodiment of the invention.

The present invention departs from conventional methodology by depositing a dielectric layer 510 over silicon layer 410, as illustrated in FIG. 5. The dielectric layer 510 may function as an etch barrier during subsequent etching. In an exemplary implementation, the dielectric layer 510 may be a silicon oxide, such as $SiO_2$, and may be deposited to a thickness ranging from about 50 Å to about 100 Å. Alternatively, other dielectric or non-dielectric materials may be used to form layer 510.

Figure 6:
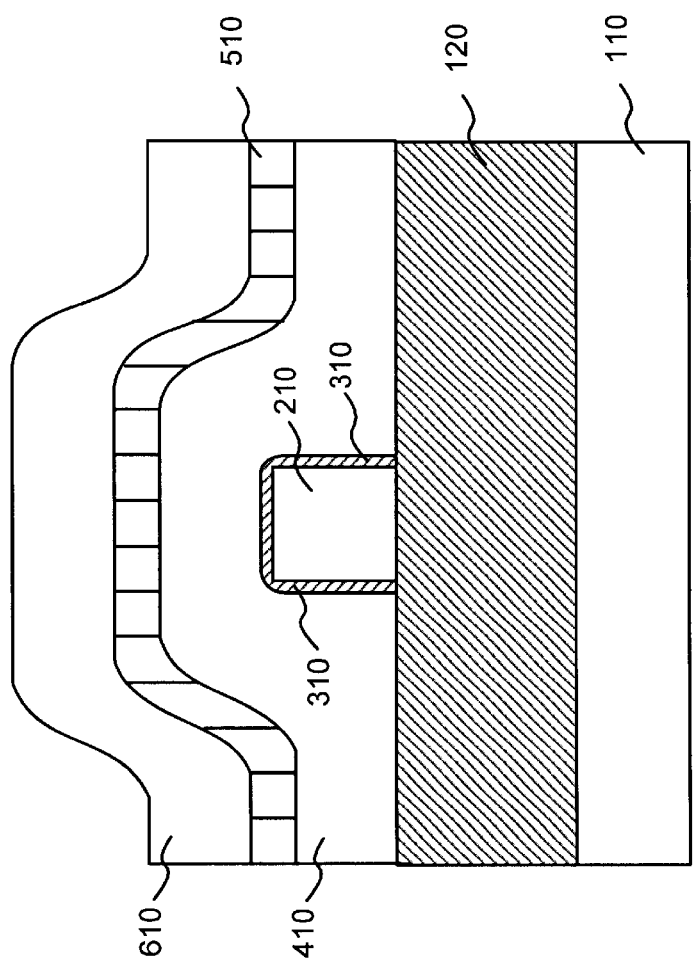
FIG. 6 is a cross-section illustrating the formation of an anti-reflective coating layer on the device of FIG. 5 in accordance with an exemplary embodiment of the present invention.

The present invention further departs from conventional methodology by depositing a bottom anti-reflective coating (BARC) layer 610 over dielectric layer 510, as illustrated in FIG. 6. The BARC layer 610 may be deposited using, for example, a spin-on process and may function to reduce reflections during subsequent lithography used to form the gate. In an exemplary implementation, the BARC layer 610 may comprise a silicon nitride (SiN) and may be deposited to a thickness ranging from about 100 Å to about 500 Å. Alternatively, other dielectric materials, such as a silicon oxynitride SiON, may be used as the BARC layer 610.

Figure 7:
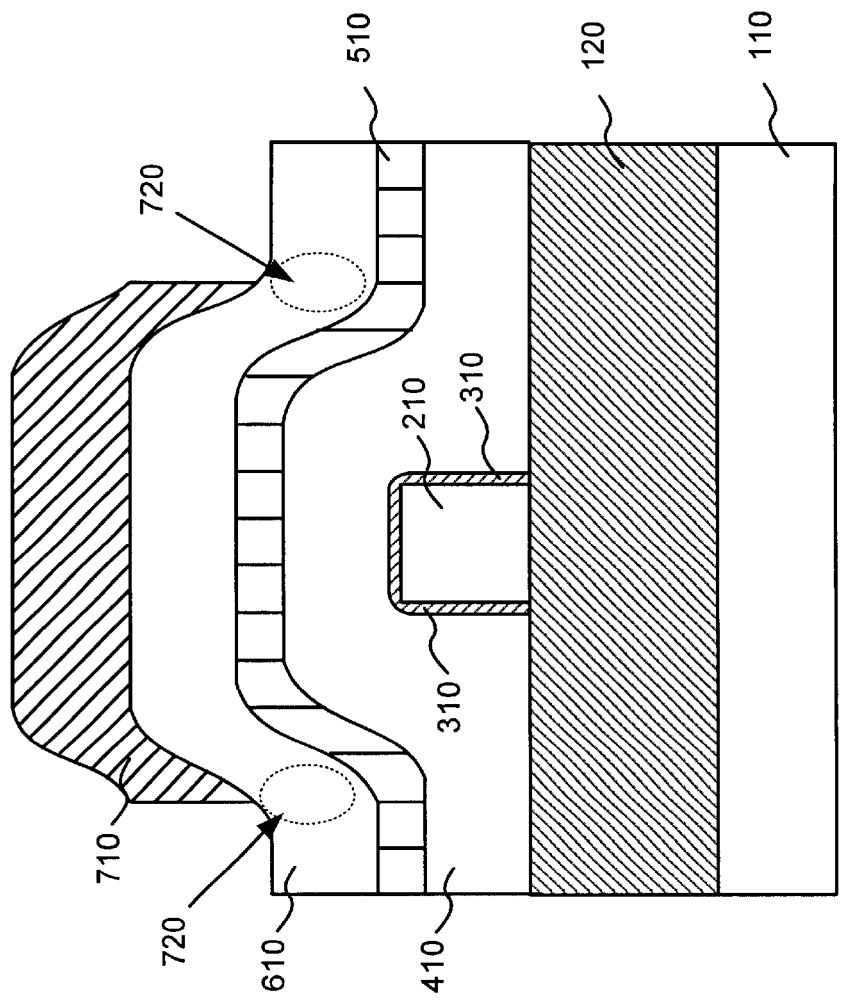
FIG. 7 is a cross-section illustrating the formation of a gate mask on the device of FIG. 6 in accordance with an exemplary embodiment of the present invention.

Next, a photoresist material may be deposited over BARC layer 610. The photoresist material may then be patterned in a conventional manner to form gate mask 710, as illustrated in FIG. 7. The particular configuration of the gate mask 710 may be based on the particular circuit requirements associated with the gate for the semiconductor device 100. For example, the photoresist material may be patterned and trimmed to form a gate mask 710 designed to achieve very small critical dimensions associated with the subsequently formed gate.

The BARC layer 610 may then be etched. The etch chemistry, particular flow rates, power ranges, bias voltages, etch duration and other parameters associated with etching BARC layer 610 may be optimized based on the thickness of BARC layer 610.

In an exemplary implementation, BARC layer 610 may also be over-etched to ensure that unwanted residual portions of BARC layer 610, referred to as "stringers," do not remain after the etching. The stringers often remain at the corner locations of BARC layer 610, as indicated by regions 720 in FIG. 7. To ensure that no stringers remain, the etching of BARC layer 610 may continue a predetermined period of time after the top surface of dielectric layer 510 has been exposed. It should be understood that the particular duration of the over-etching is based on the particular device parameters, such as the thicknesses of BARC layer 610 and dielectric layer 510. In each case, the over-etching ensures that no BARC stringers remain in regions 720 after the BARC layer 610 has been etched.

In addition, the particular etch chemistry used to etch BARC layer 610 may be chosen such that the etch selectivity of the BARC layer 610 relative to the underlying dielectric layer 510 is high. That is, the etch chemistry is selected such that BARC layer 610 will be etched at a much greater rate than dielectric layer 510. This ensures that the over-etching will not result in the rapid removal of dielectric layer 510 and the etching into other areas, such as the source/drain areas 220 and 230. Therefore, the dielectric layer 510 is able to protect critical areas of semiconductor device 100 from undesired etching.

After the BARC layer 610 has been completely etched, silicon layer 410 may be etched to form the gate for semiconductor device 100. The etch chemistry, particular flow rates, power ranges, bias voltages, etch duration and other parameters associated with etching silicon layer 410 may be optimized based on the thickness of silicon layer 410 and the particular device requirements.

Figure 8A:
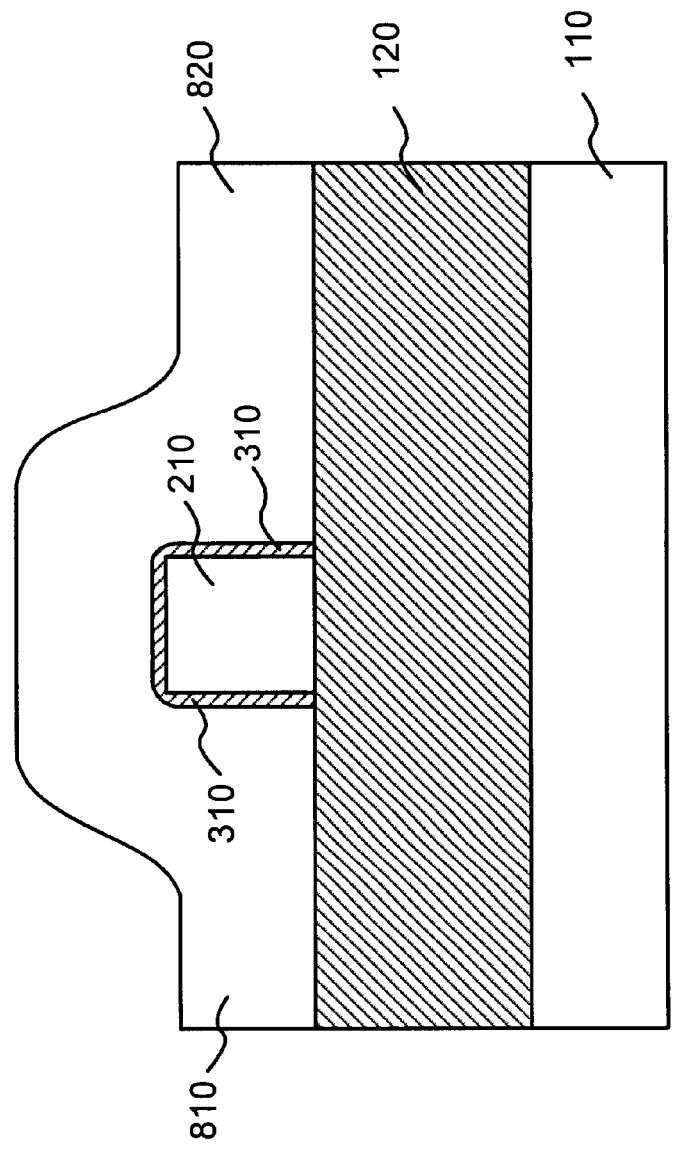
FIG. 8A is a cross-section illustrating the formation of a gate in accordance with an exemplary embodiment of the present invention.

After silicon layer 410 has been etched, gate mask 710 and the portions of BARC layer 610 and dielectric layer 510 located below gate mask 710 may be stripped, resulting in semiconductor device 100 illustrated in FIG. 8A. Referring to FIG. 8A, the silicon layer 410 has been patterned and etched to form gates 810 and 820 for semiconductor device 100. Advantageously, barrier dielectric layer 510 and the high etching selectivity of the BARC layer 610 with respect to the barrier dielectric layer 510 protected the silicon in the source/drain areas 220 and 230 from being etched.

In some implementations consistent with the present invention, the semiconductor device 100 illustrated in FIG. 8A may be planarized, via for example, a chemical-mechanical polishing (CMP), to remove the portion of silicon layer 410 above fin 210. In this implementation, the gate material above fin 210 will be planarized so that the gate material in the vertical direction is approximately even with the gate oxide 310 located over the top surface of fin 210. In this case, gates 810 and 820 will be electrically separated by fin 210 and maybe separately biased during operation of semiconductor device 100.

Figure 8B:
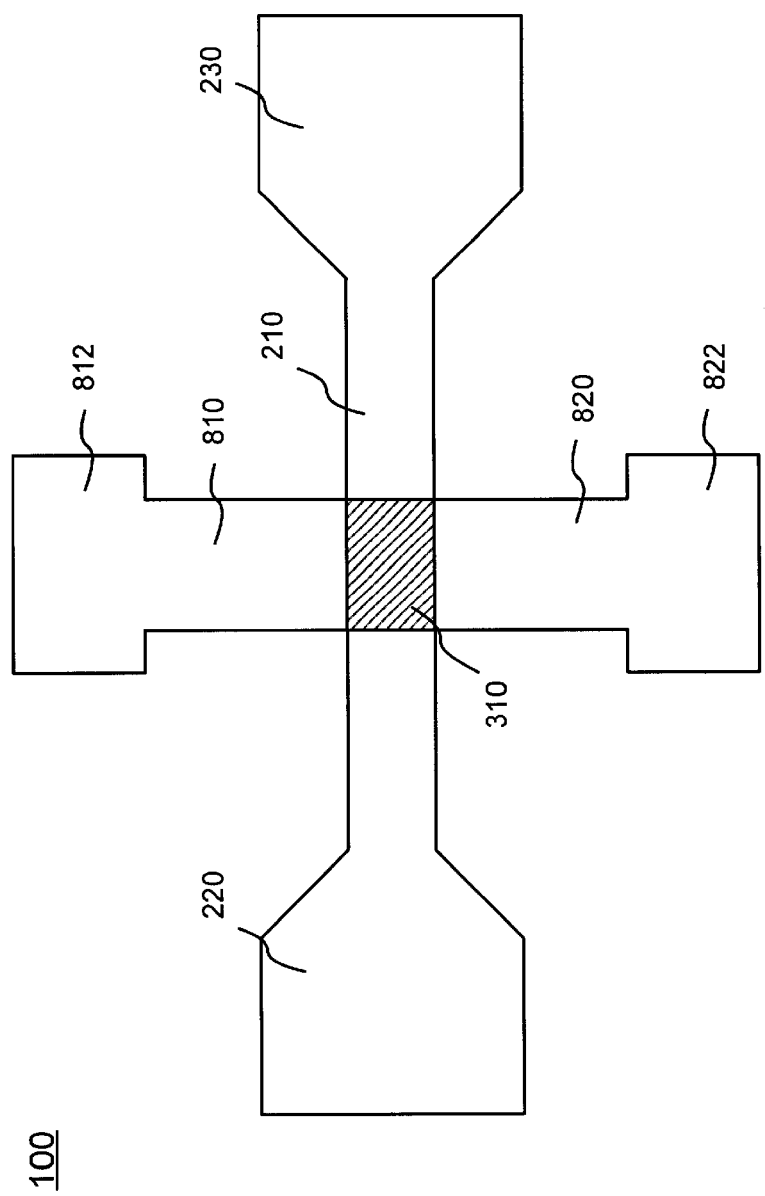
FIG. 8B is a top view illustrating an exemplary double-gate device formed in accordance with an exemplary embodiment of the present invention.

FIG. 8B illustrates a top view of semiconductor device 100 consistent with the present invention after the gate etching has been performed. As illustrated, semiconductor device 100 includes a double gate structure with gates 810 and 820 disposed on either side of fin 210 with gate dielectric 310 formed over the fin 210. Gates 810 and 820 may include gate electrodes or contacts 812 and 822 formed at the respective ends of gates 810 and 820, as illustrated in FIG. 8B. A metal, such as tungsten, cobalt, titanium, or tantalum, may be deposited over the gates 810 and 820 followed by a thermal annealing to form a metal-silicide compound on the top surfaces of gates 810 and 820.

The source/drain regions 220 and 230 may then be doped. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such steps are not disclosed herein in order not to unduly obscure the thrust of the present invention. In addition, sidewall spacers may optionally be formed prior to the source/drain ion implantation to control the location of the source/drain junctions based on the particular circuit requirements. Activation annealing may then be performed to activate the source/drain regions 220 and 230.

The resulting semiconductor device 100 illustrated in FIG. 8B is a double-gate device with a first gate 810 and a second gate 820. The gates 810 and 820 may be electrically and physically separated by fin 210, as discussed previously. In this case, each of the gates 810 and 820 may be separately biased when used in a circuit since they are effectively disconnected from each other by the fin 210.

Thus, in accordance with the present invention, a double-gate FinFET device is formed in an efficient manner. Advantageously, the gates 810 and 820 of the FinFET device may be formed without damaging other areas of the FinFET device, such as the source/drain regions, thereby yielding better device performance. In addition, gates 810 and 820 may also be formed without residual stringer material that may have an adverse effect on device performance. The resulting structure exhibits good short channel behavior. The present invention can also be easily integrated into conventional semiconductor fabrication processing.

OTHER EMBODIMENTS

In other embodiments of the present invention, FinFETs with vertical, uniformly doped gates may be formed. For example, FIG. 9A illustrates a cross-sectional view of a FinFET device 900 that includes a source region 910, a drain region 920 and fin 930. These regions/structures may be formed on buried oxide layer 940 in a conventional manner. A protective layer may be deposited and etched using a damascene process to form protective regions 950 over the source/drain regions 910 and 920, as illustrated in FIG. 9A. The protective layer, however, does not cover fin 930.

After the protective regions 950 are formed, a layer of silicon, such as polysilicon, may be deposited and etched to form gate 960, as illustrated in FIG. 9B. Impurities may then be ion implanted to dope gate 960, followed by a laser thermal annealing. During the laser thermal annealing, the dopants in gate 960 will be activated. After the laser thermal annealing, the gate 960 of FinFET 900 is uniformly doped in the vertical direction.

In another embodiment of the present invention, a FinFET may be formed with a high-K gate dielectric. FIGS. 10A-10D are cross-sections illustrating exemplary processing for forming a FinFET with a high-K gate dielectric. Referring to FIG. 10A, device 1000 includes a buried oxide (BOX) layer 1010 formed on a substrate, silicon fin 1020, dielectric cap 1030, gate oxide 1040 and gate electrode layer 1050. Dielectric cap 1030 may comprise silicon nitride and gate electrode layer 1050 may comprise polysilicon. These layers/structures may be formed in a conventional manner.

After source/drain ion implantations and activation annealing are performed, a tetraethyl orthosilicate (TEOS) $SiO_2$ deposition may be performed, followed by a chemical-mechanical polishing (CMP). Next the gate electrode layer 1050 and gate oxide 1040 are removed, resulting in device 1000 illustrated in FIG. 10B.

A thin aluminum layer 1060 having a thickness of about 10 Å to about 30 Å may then be deposited and oxidized to form a high-K aluminum oxide, such as $Al_2O_3$, as illustrated in FIG. 10C. The dielectric layer 1060 may be used as a gate insulator and may have a high-K value (e.g., $\epsilon \approx 8$). Next, a metal layer, such as tantalum, tantalum nitride, tungsten or another metal, may be deposited to form metal gate 1070, as illustrated in FIG. 10D. The resulting semiconductor device 1000 includes a high-K gate dielectric 1060 and a metal gate 1070.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of double-gate semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail. In addition, while a series of processes for forming the semiconductor device of FIG. 8B has been described, it should be understood that the order of the processes may be varied in other implementations consistent with the present invention.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of forming a gate in a FinFET device, comprising:
    forming a resist mask over a portion of a silicon on insulator (SOI) wafer, the SOI wafer comprising a silicon layer on an insulating layer;
    etching the silicon layer not covered by the resist mask to form a fin, the fin having a plurality of side surfaces and a top surface;
    forming a gate oxide on the plurality of side surfaces and the top surface of the fin;
    depositing a gate layer over the fin;
    depositing a dielectric layer over the gate layer;
    depositing a bottom anti-reflective coating (BARC) layer over the dielectric layer;
    forming a gate mask over the BARC layer;
    etching the BARC layer, the etching terminating on the dielectric layer; and
    etching the gate layer to form the gate.

2. The method of claim 1, further comprising:
    removing the BARC layer and the dielectric layer located under the gate mask.

3. The method of claim 1, wherein the dielectric layer comprises an etch barrier and wherein the etching the BARC layer includes:
    etching the BARC layer until the etch barrier is exposed, and
    continuing the etching a predetermined period of time after the etch barrier is exposed.

4. The method of claim 3, wherein the etch barrier comprises silicon dioxide and has a thickness ranging from about 50 Å to about 100 Å.

5. The method of claim 1, wherein the dielectric layer comprises a silicon oxide and the BARC layer comprises a silicon nitride.

6. The method of claim 1, wherein the etching the BARC layer includes:
    using an etch chemistry having a high etch selectivity for the BARC layer relative to the dielectric layer.

7. The method of claim 1, wherein the BARC layer comprises at least one of a silicon nitride and a silicon oxynitride and has a thickness ranging from about 100 Å to about 500 Å and the dielectric layer comprises a silicon oxide having a thickness ranging from about 50 Å to about 100 Å.

8. The method of claim 7, wherein the etching the BARC layer comprises:
    over-etching the BARC layer to ensure that all of the BARC layer not located under the gate mask is removed.

9. A method of manufacturing a semiconductor device, comprising:
    forming a fin on an insulating layer, the fin including first and second side surfaces and a top surface;
    forming source and drain regions;
    forming a gate oxide on the first and second side surfaces and the top surface of the fin;
    depositing a gate material over the insulating layer and the fin, the gate material surrounding the gate oxide formed on the fin;
    depositing a barrier layer over the gate material;
    depositing a bottom anti-reflective coating (BARC) layer over the barrier layer;
    forming a gate mask over the BARC layer;
    etching the BARC layer, the etching terminating on the barrier layer; and
    etching the gate material to form a gate.

10. The method of claim 9, further comprising:
    removing the BARC and barrier layers located below the gate mask.

11. The method of claim 9, wherein the etching the BARC layer includes:
    etching the BARC layer until the barrier layer is exposed, and
    continuing the etching a predetermined period of time after the BARC layer is exposed.

12. The method of claim 9, wherein the barrier layer comprises silicon dioxide and has a thickness ranging from about 50 Å to about 100 Å.

13. The method of claim 9, wherein the barrier layer comprises a silicon oxide and the BARC layer comprises at least one of a silicon nitride and a silicon oxynitride.

14. The method of claim 9, wherein the etching the BARC layer includes:
    using an etch chemistry having a high etch selectivity for the BARC layer relative to the barrier layer.

15. The method of claim 9, wherein the etching the BARC layer comprises:
    over-etching the BARC layer after the barrier layer is exposed.

16. A method of manufacturing a semiconductor device, comprising:
    forming a fin structure on an insulating layer, the fin structure having a plurality of side surfaces, a top surface and a bottom surface;
    forming source and drain regions;
    forming a gate dielectric on at least a first and second side surface of the fin;
    depositing a gate material over the insulating layer and the fin structure;

forming a dielectric layer over the gate material;

depositing an anti-reflective coating (ARC) layer over the dielectric layer;

forming a gate mask over the ARC layer;

etching the ARC layer, the etching terminating on the dielectric layer; and etching the gate material to form at least one gate.

17. The method of claim 16, wherein the etching the ARC layer comprises:

using an etch chemistry that has a high etch selectivity for the ARC layer relative to the dielectric layer.

18. The method of claim 16, further comprising:

continuing the etching of the ARC layer a predetermined period of time after the dielectric layer has been exposed.

19. The method of claim 16, wherein the ARC layer comprises a bottom anti-reflective coating (BARC) layer, the BARC layer comprising at least one of silicon nitride and silicon oxynitride having a thickness ranging from about 100 Å to about 500 Å and the dielectric layer comprises a silicon oxide having a thickness ranging from about 50 Å to about 100 Å.

* * * * *